Figure 1:
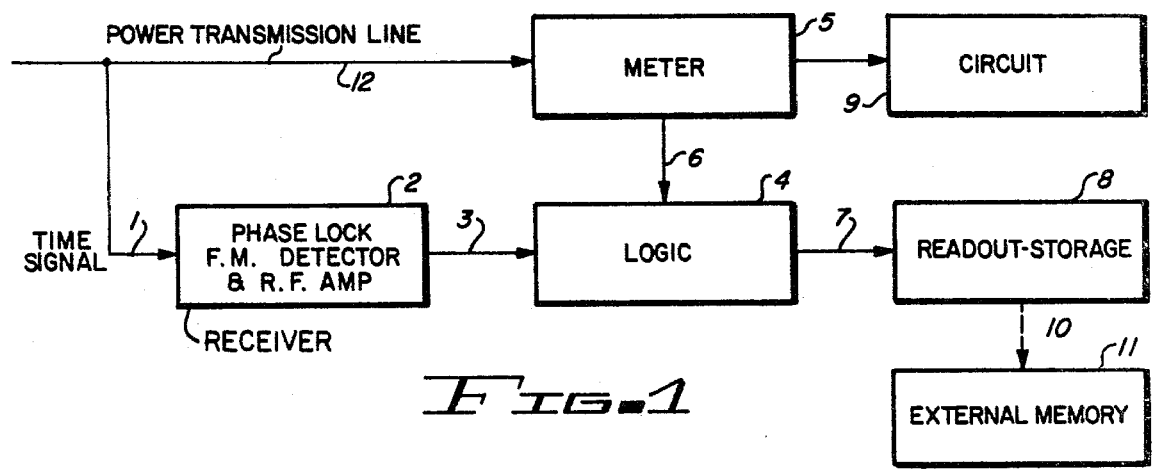

United States Patent [19]

Emerson et al.

[11] 4,348,730
[45] * Sep. 7, 1982

[54] SYSTEM FOR METERING ELECTRICAL ENERGY WITH REMOTE TIME SIGNAL CORRELATION

[75] Inventors: Paul J. Emerson, Scottsdale; Walter P. Hedges, Laveen, both of Ariz.

[73] Assignee: Cyborex Laboratories, Inc., Phoenix, Ariz.

[*] Notice: The portion of the term of this patent subsequent to Aug. 5, 1997, has been disclaimed.

[21] Appl. No.: 154,774

[22] Filed: May 30, 1980

Related U.S. Application Data

[63] Continuation of Ser. No. 914,029, Jun. 9, 1978, Pat. No. 4,216,527.

[51] Int. Cl.³ .................. G01R 21/06; G06F 15/20
[52] U.S. Cl. .................................. 364/483; 324/142; 340/310 A; 364/464

[58] Field of Search ............... 364/483, 464; 340/150, 340/310 A; 324/103, 142

[56] References Cited

U.S. PATENT DOCUMENTS

| 706,575 | 8/1902 | Lunt | 340/310 A |
| 3,818,340 | 6/1974 | Yamaguchi | 324/142 |
| 3,925,728 | 12/1975 | Whyte | 324/142 |
| 3,980,954 | 9/1976 | Whyte | 340/310 A |
| 4,080,568 | 3/1978 | Funk | 324/142 |

FOREIGN PATENT DOCUMENTS

| 1774150 | 12/1971 | Fed. Rep. of Germany | 364/464 |
| 2641806 | 3/1978 | Fed. Rep. of Germany | 324/142 |

*Primary Examiner*—Felix D. Gruber
*Attorney, Agent, or Firm*—Cahill, Sutton & Thomas

[57] ABSTRACT

A system for monitoring electrical energy consumption in a circuit in which signals from the current sensor are correlated with a time signal received from a remote location.

6 Claims, 2 Drawing Figures

SYSTEM FOR METERING ELECTRICAL ENERGY WITH REMOTE TIME SIGNAL CORRELATION

This is a continuation, of application, Ser. No. 914,029, filed June 9, 1978, and now U.S. Pat. No. 4,216,527.

This invention relates to a system for metering the electrical energy consumption in a circuit.

In a more specific respect, the invention relates to an electrical energy metering system which provides time-correlated electrical energy consumption data.

In another aspect, the invention concerns a system specially adapted for use at private residences for providing so-called "time-of-day" metering of electrical energy consumption.

Higher fuel prices and increased capital costs for building power generation facilities have caused many utility companies to seek means of reducing the consumption of electrical energy, particularly by residential customers, especially during the so-called "peak" hours of the day, during which the utility companies are usually forced to place additional generating facilities on-line to meet the demand. These additional generating facilities (generally referred to as the "peaking plant") generally consume higher priced and less readily available fuels than the facilities which are normally operated to supply the electrical power demand during the so-called "off-peak" hours.

Various energy management systems have been proposed which require or at least attempt to persuade utility customers to limit the electrical energy consumption during the peak hours. One such system arbitrarily imposes an upper limit on the instantaneous current drawn by the residential circuit and, when the current rises above a preselected threshold value, various of the loads in the residence are shed to reduce the current consumption to below the preselected threshold. The consumer may restore the load or loads which have been shed only by reducing the current demand by shutting off other loads.

According to the so-called "time-of-day" energy management program, the customer is allowed to use as much total electrical power as he desires and, further, is allowed to utilize it at any desired rate of consumption. However, the rate charged for the power consumed varies during the day and, in some cases, with the day of week and day of year (to account for weekend and holiday usage). The customer is charged a marked premium for power consumed during the normal daily peak demand period of the utility and is charged correspondingly lower rates for power consumed in the off-peak hours and on off-peak days, such as weekends and holidays. The net effect of the time-of-day rate schedule is to give the consumer a very real incentive to utilize the less essential appliances, such as washing machines, dryers, swimming pool pumps and heaters, etc., during off-peak hours so that his consumption of power during the on-peak high rate period for more essential appliances, such as air-conditioners, furnace fans, cooking stoves, etc., will be kept to a minimum. In one variation of the time-of-day rate system, the customer's power consumption during the peak demand period is monitored throughout the billing period and the highest current demand during any one of the daily high-rate periods is used to determine the particular customer's penalty for peak demand period usage for the entire billing cycle.

From the foregoing, it will be apparent to those skilled in the art that the metering function in a time-of-day energy management system is crucial and the key requirement for a successful time-of-day metering system is the provision of means for accurately correlating the electrical energy consumption in a residential circuit with accurate local time.

Electrical meters which correlate current demand and/or power consumption with local time are known. Conventional electrical meters with mechanical movements have been provided with clocks which cause the meters to store the demand and/or power consumption data in different time-identified mechanical registers. These prior art meters, however, are not entirely satisfactory for several reasons. First, upon start-up of the meter, the clock must be set accurately by a utilities technician. Secondly, the clocks (electrically wound spring-driven mechanisms) are not notoriously accurate and their accuracy must be checked periodically. A major problem is encountered if a power failure occurs of a duration longer than the capacity of the spring mechanism. In this case, the clock stops and must once again be reset by a utilities technician. This latter problem is partially solved by the provision of a standby battery which operates the spring winding mechanism in the event of a power failure. However, the batteries, themselves, fail periodically and, in any event, must be replaced periodically as they have only a finite shelf life.

Accordingly, it is a principal object of the present invention to provide a system for metering electrical energy consumption in a circuit especially adapted for use in time-of-day energy management programs.

Another object of the invention is to provide a time-of-day electrical energy metering system which correlates energy consumption with a time signal received from a remote location such that both the utility and the customer are assured of a high degree of accuracy in the correlation of time and energy consumption data.

Yet another object of the invention is to provide a metering system specially adapted for implementing time-of-day energy management programs at a plurality of residential locations which are remote from the utility company's power generation and transmission substation facilities.

Figure 2:
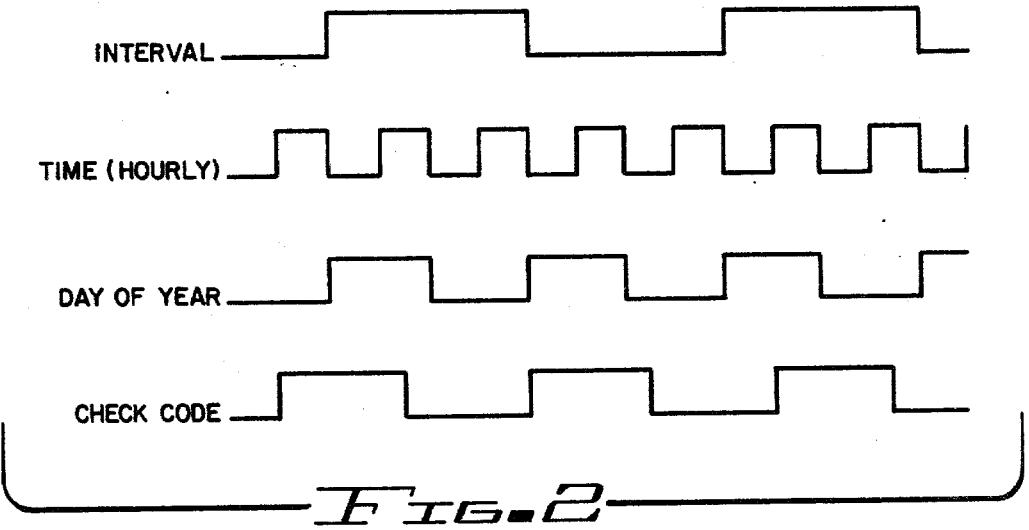

These and other, further and more specific objects and advantages of the invention will be apparent to those skilled in the art from the following detailed description thereof, taken in conjunction with the drawings, in which:

FIG. 1 is a drawing which schematically illustrates the interrelationship of the various components of a system embodying the present invention; and FIG. 2 is an illustration of the various waveforms which may comprise the signal transmitted to the metering system from a remote location.

Before proceeding further, it should be noted that, by definition, "power" (watts or kilowatts) is equal to voltage (volts) multiplied by current (amperes) and the power factor and is also equal to the instantaneous rate of flow of energy. Energy (kilowatt-hours) is the product of power (watts) and the amount of time (hours) that the energy flows from one place to another. However, the terms "power" and "energy" are commonly used interchangeably, when there is no likelihood of confusion. For example, it is common to use the terms "power consumption" and "energy consumption" to mean the same thing.

It should be noted that power meters of the type used to determine the amount of energy delivered to a residence commonly include induction type rotors. The rate at which such a rotor rotates is proportional to the power, i.e., the rate of energy being delivered to the residence. The induction type rotor usually drives a counter. The reading of the counter represents energy, i.e., the number of kilowatt hours, delivered to the residence over a period of time. However, in some instances, especially where an instantaneous indication of the amount of power delivered to a residence is desired, it is more convenient to use a current coil to measure the instantaneous current being delivered to the residence than to utilize a mechanism that determines the rate at which the induction rotor of a conventional power meter turns. The power delivered to the residence then can be obtained by simply multiplying the voltage, which is usually constant, by the measured instantaneous current. In either case, the information that is actually obtained is the power, i.e., number of watts, being instantaneously delivered to the residence.

Briefly, in accordance with the invention, we provide improvements in prior art systems for metering the electrical energy consumption in a circuit. Such prior art systems normally include means for sensing the electrical power consumption in the circuit and for generating signals in response thereto. Certain of such prior art systems also included clock means for generating time signals and means for correlating the time signals with the power consumption signals. The improvements provided by our invention comprise, in combination with said sensing means, means for receiving a time signal from a location remote from said circuit, and means operatively associated with said receiving means and said sensing means for correlating the time signal with the current consumption signal (if instantaneous current is being sensed by the meter) or the power consumption signal (if instantaneous power is being sensed by the meter). In the presently preferred embodiment of the invention, the time signal is an accurate local time signal, i.e., at least the accurate hourly time and, preferably, also includes day of week and/or either day of month or day of year. The signal may also optionally include a time interval signal and a "check code" by which the accuracy of correlation of current consumption data and time data can be monitored.

In a further preferred embodiment of the invention, the time signal is transmitted to the metering system by impressing it on the power line which also supplies the electrical energy to the circuit. The system of the invention may also preferably include means for temporarily storing the time-current data (if instantaneous current is being sensed by the metering system) or the time-power data (if power is what is being sensed by the metering system) resulting from the correlation of the signals and means for displaying the correlated time-current or time-power data at the location of the circuit so as to enable the residential consumer to personally check the correlated data periodically at any time during the billing cycle. The system also preferably includes means for periodically transferring the stored data to an external memory for use in preparing the utility customer's bill for electrical power consumed during the billing cycle.

Turning now to the drawings, FIG. 1 schematically illustrates a system for metering (in the sense of measuring by means of a meter, rather than supplying in a measured or regulated amount); electrical energy consumption incorporating the principles of the invention. The time signal 1 is applied to a receiver 2 which, as indicated, includes a phase-lock FM detector and RF amplifier. The amplified time signal 3 from the receiver 2 is fed to the logic 4 of a microprocessor. A meter 5 senses the power, (i.e., the rate of electrical energy consumption) of the circuit 9 and generates a signal 6 in response thereto which is also applied to the logic 4 of the microprocessor. The logic 4 correlates the time signal 3 and the electrical energy consumption signal 6 and the data 7 resulting from such correlation is fed to the readout-storage components 8 of the system. As indicated by the dashed line 10, the stored time-current (if instantaneous current is what is being sensed by the meter) or time-power data (if power is what is being sensed by the meter data is periodically transferred to an external memory 11, from which the data may be recovered and used in preparing the bill to the utility customer for the power consumed in the circuit 9 during the billing cycle.

As indicated in FIG. 1, the time signal 1 is transmitted to the receiver 2 by impressing it on the power transmission line 12 which supplies electrical energy to the circuit 9. Alternatively, the time signal 1 could be supplied to any suitable receiving means in any other suitable fashion. For example, the time signal could be broadcast from a remote location such as the utility company's transmission sub-station or from a central transmitter which services the utility company's entire power distribution network. The broadcast signal can be received through a conventional antenna which feeds the received time signal to the receiver 2. In accordance with yet another embodiment of the invention, the antenna and receiver can be tuned to receive time signals emanating from any of the various governmental transmitter which provide time dissemination broadcasts. Illustratively, the antenna-receiver could be tuned to receive and utilize the time signals broadcast by the National Bureau of Standards from radio station WWVB on a standard radio carrier frequency of 60 KHz. These signals, broadcast from the Bureau of Standards WWVB transmitter located in Boulder Colorado, have a field intensity of at least 100 $\mu$V/m throughout virtually the entire United States. Further information concerning the National Bureau of Standards time dissemination serves is found in the NBS SPECIAL PUBLICATION 432, published by the National Bureau of Standards, U.S. Dept. of Commerce (January, 1976).

The WWVB signal provides time information in the form of a "BCD" time code corresponding to the current minute, hour and day on the UTC time scale, According to the presently preferred embodiment of the invention, this signal is received at the utility company's power transmission sub-stations and is processed to convert the UTC time to a local time signal. The processed signal is then further modified to provide any additional time information such as time interval and, optionally, a check code. The resultant signal may, for example, include several forms of the general type illustrated in FIG. 2.

The readout-storage components (reference character 8, FIG. 1) provide the capability of displaying selected portions of the accumulated correlated time-energy consumption data 7. For example, the components can be arranged to provide a readout for the utility customer of the instantaneous current (amperes) or the instantaneous power (kilowatts) in the circuit, the cumulative energy consumption (kilowatt hours) since the beginning of the billing period, the highest current or power demand occurring during the "peak period" to date during the billing cycle, etc. Additionally, the components provide for at least temporary storage of the accumulated data 7, such that, periodically, the data can be transferred to an external memory 11. The storage components in the readout storage unit 8 can be interrogated by any suitable technique such as, for example, by transfer to a portable cassette memory unit.

The data stored in the external memory is then handled by conventional data processing techniques to prepare the periodic billings to the utility customer for the billing period in question.

Having described our invention in such terms as to enable those skilled in the art to understand and practice it, we claim:

1. In a system for metering the electrical energy consumption in each of a plurality of separate circuits and correlating said electrical energy consumption with time, said system including in each of said separate circuits meter means for sensing a quantity indicative of the amount of electrical energy consumption in each of said circuits and for generating signals indicative of the amount of said electrical energy consumption in response to said sensing, timing means for generating time signals, and logic means in each of said circuits for correlating said signals indicative of said amount of said electrical energy consumption and said time signals, the improvements comprising receiver-logic means in each of said plurality of separate circuits for receiving a common time signal generated at and transmitted from a location remote from said plurality of separate circuits and for separately correlating said time signals with said signals indicative of said amount of said electrical energy consumption for each of said circuits to provide data correlating said time signals with said signals indicative of said amount of electrical energy consumption for each of said separate circuits.

2. The system of claim 1 in which said time signal is a local time signal.

3. The system of claim 1 in which said time signal is transmitted to said metering system on the power line supplying electrical energy to said circuit.

4. The system of claim 1 which includes means for temporarily storing said data resulting from the correlation of said signals.

5. The system of claim 1 which includes means for displaying said data at the location of said circuit.

6. The system of claim 4 including means for periodically transferring said stored data to an external memory.

* * * * *